(12) United States Patent
Wu et al.

(10) Patent No.: US 11,215,913 B2
(45) Date of Patent: Jan. 4, 2022

(54) PROJECTOR DRIVE CIRCUIT, PROJECTOR DRIVE METHOD AND PROJECTOR

(71) Applicant: Qisda Corporation, Taoyuan (TW)

(72) Inventors: Chih-Hsiang Wu, New Taipei (TW); Chi-Jen Chen, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 21 days.

(21) Appl. No.: 16/726,325

(22) Filed: Dec. 24, 2019

(65) Prior Publication Data

US 2020/0249556 A1   Aug. 6, 2020

(30) Foreign Application Priority Data

Jan. 31, 2019   (CN) .......................... 201910099132.7

(51) Int. Cl.
*G03B 21/20* (2006.01)
*H04N 9/31* (2006.01)
*G03B 21/00* (2006.01)
*H01S 5/042* (2006.01)

(52) U.S. Cl.
CPC ......... *G03B 21/206* (2013.01); *G03B 21/006* (2013.01); *G03B 21/2053* (2013.01); *H04N 9/3155* (2013.01); *H01S 5/042* (2013.01)

(58) Field of Classification Search
CPC ................ G03B 21/006; G03B 21/008; G03B 21/2053; G03B 21/206; H04N 9/3155; H01S 5/042
See application file for complete search history.

(56) References Cited

U.S. PATENT DOCUMENTS

| | | | |
|---|---|---|---|
| 10,091,473 B1* | 10/2018 | Chen ................... | G03B 21/2053 |
| 2009/0021183 A1* | 1/2009 | Ye ....................... | H05B 45/3725 |
| | | | 315/291 |
| 2011/0089859 A1* | 4/2011 | Tseng ..................... | H05B 45/46 |
| | | | 315/294 |
| 2012/0013268 A1* | 1/2012 | Chou ...................... | H05B 45/37 |
| | | | 315/301 |
| 2017/0262095 A1* | 9/2017 | Reynolds ............. | G06F 3/04166 |
| 2020/0145605 A1* | 5/2020 | Lu ............................ | H04N 7/04 |

FOREIGN PATENT DOCUMENTS

CN    107567132 A    1/2018

OTHER PUBLICATIONS

Office action of counterpart application by SIPO dated Oct. 19, 2020.

* cited by examiner

*Primary Examiner* — Michelle M Iacoletti
*Assistant Examiner* — Magda Cruz (57) ABSTRACT

A projector drive circuit includes a first voltage converter, a light source driver, a second voltage converter, and an isolation circuit. The first voltage converter converts a first voltage into a second voltage. The light source driver converts the second voltage into a third voltage. The second voltage converter converts the second voltage into a fourth voltage. The control circuit, coupled to the second voltage converter, receives the fourth voltage and outputs a first control signal. The isolation circuit, coupled to the control circuit and the light source driver, receives the first control signal and generates a second control signal to the light source driver, which controls the light source driver to generate the third voltage and provide the third voltage to a light source according to the second control signal. The isolation circuit electrically isolates the control circuit from the light source driver.

13 Claims, 6 Drawing Sheets

PROJECTOR DRIVE CIRCUIT, PROJECTOR DRIVE METHOD AND PROJECTOR

This application claims the benefit of People's Republic of China application Serial No. 201910099132.7, filed Jan. 31, 2019, the subject matter of which is incorporated herein by reference.

BACKGROUND OF THE INVENTION

Field of the Invention

The invention relates in general to a drive circuit, a drive method and a projector.

Description of the Related Art

Laser projection has the feature of simple use. That is, when the projector is in a sleep state, the projector can automatically reduce its brightness to save power. Furthermore, the projector can automatically adjust its brightness according to the ambient brightness. Since laser projection has become the core of the projection technology, many manufacturers have already put a considerable amount of resources into the research and development in the technology of laser projection. Currently, laser projection has dominated almost the entire projector market.

Therefore, how to increase the power efficiency of the projector drive circuit and at the same time reduce the cost of the projector drive circuit has become a prominent task for the industries.

SUMMARY OF THE INVENTION

According to an embodiment of the present invention, a projector drive circuit is provided. The projector drive circuit includes: a first voltage converter configured to convert a first voltage into a second voltage; a light source driver coupled to the first voltage converter to convert the second voltage into a third voltage; a second voltage converter coupled to the first voltage converter to convert the second voltage into a fourth voltage; a control circuit coupled to the second voltage converter to receive the fourth voltage and output a first control signal; and an isolation circuit coupled to the control circuit and the light source driver to receive the first control signal and accordingly generate a second control signal to the light source driver, which controls the light source driver to generate the third voltage and provide the third voltage to a light source according to the second control signal, wherein, the isolation circuit is configured to electrically isolate the control circuit from the light source driver.

According to another embodiment of the present invention, a projector drive method is provided. The projector drive method includes: converting a first voltage into a second voltage and outputting the second voltage to a light source driver and a second voltage converter by a first voltage converter; converting the second voltage into a third voltage by the light source driver; converting the second voltage into a fourth voltage and outputting the fourth voltage to a control circuit by the second voltage converter; receiving the fourth voltage and outputting a first control signal to an isolation circuit by the control circuit; receiving the first control signal and accordingly generating a second control signal to the light source driver by the isolation circuit, wherein the light source driver controls a light source according to the second control signal, and the isolation circuit is configured to electrically isolate the control circuit from the light source driver; and receiving the third voltage and providing a light by the light source.

According to an alternate embodiment of the present invention, a projector is provided. The projector includes a light source and a drive circuit coupled to the light source. The drive circuit includes: a first voltage converter configured to convert a first voltage into a second voltage; a light source driver coupled to the first voltage converter to convert the second voltage into a third voltage; a second voltage converter coupled to the first voltage converter to convert the second voltage into a fourth voltage; a control circuit coupled to the second voltage converter to receive the fourth voltage and output a first control signal; and an isolation circuit coupled to the control circuit and the light source driver to receive the first control signal and accordingly generate a second control signal to the light source driver, which controls the light source driver to generate the third voltage according to the second control signal, the light source receives the third voltage and provides a light, wherein, the isolation circuit is configured to electrically isolate the control circuit from the light source driver.

The above and other aspects of the invention will become better understood with regard to the following detailed description of the preferred but non-limiting embodiment(s). The following description is made with reference to the accompanying drawings.

DETAILED DESCRIPTION OF THE INVENTION

Technical terms are used in the specification with reference to generally-known terminologies used in the technology field. For any terms described or defined in the specification, the descriptions and definitions in the specification shall prevail. Each embodiment of the present disclosure has one or more technical characteristics. Given that each embodiment is implementable, a person ordinarily skilled in the art can selectively implement or combine some or all of the technical characteristics of any embodiment of the present disclosure.

Figure 1:
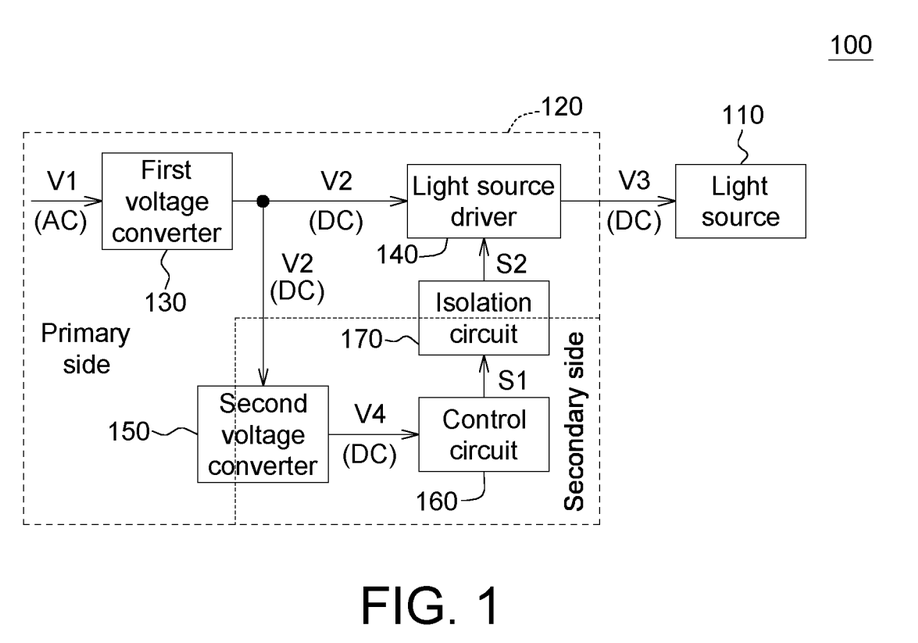
FIG. 1 is a functional block diagram of a projector according to an exemplary embodiment of the present disclosure.

FIG. 1 is a functional block diagram of a projector according to an exemplary embodiment of the present disclosure. The projector 100 (such as a laser projector) is configured to generate a projection image. The projector 100 includes a light source 110 and a drive circuit 120. The drive circuit 120 includes a first voltage converter 130, a light source driver 140, a second voltage converter 150, a control circuit 160 and an isolation circuit 170.

The first voltage converter 130, configured to convert a first voltage V1 (an AC voltage provided by a mains supply) into a second voltage V2 (a DC voltage), includes a first terminal (not illustrated) configured to receive the first voltage V1 and a second terminal (not illustrated) configured to output the second voltage V2. For example, the first voltage V1 can be an AC voltage provided by the mains supply, and the second voltage V2 can be a DC voltage. For example, the first voltage V1 can be 110V or 220V, and the second voltage V2 can be 380V.

The light source driver 140, coupled to the first voltage converter 130, converts the second voltage V2 into a third voltage V3. The light source driver 140 includes a third terminal (not illustrated) coupled to the second terminal of the first voltage converter 130 and a fourth terminal (not illustrated) configured to output the third voltage V3 to the light source 110. The third voltage V3 can be a DC voltage lower than the second voltage V2. For example, the third voltage V3 can be 48V.

The second voltage converter 150, coupled to the first voltage converter 130 and configured to convert the second voltage V2 into a fourth voltage V4, includes a fifth terminal (not illustrated) coupled to the second terminal of the first voltage converter 130 and a sixth terminal (not illustrated) configured to output the fourth voltage V4. The fourth voltage V4 can be a low DC voltage of 3.3V or 12V.

The control circuit 160, coupled to the second voltage converter 150, includes a seventh terminal (not illustrated) coupled to the sixth terminal of the second voltage converter 150 and an eighth terminal (not illustrated) configured to output the first control signal S1. The control circuit 160 outputs the first control signal S1 to the isolation circuit 170.

The isolation circuit 170, coupled to the control circuit 160 and the light source driver 140, includes a ninth terminal (not illustrated) coupled to the eighth terminal of the control circuit 160 and a tenth terminal (not illustrated) configured to output the second control signal S2. The isolation circuit 170 outputs the second control signal S2 to the light source driver 140, which accordingly generates voltages with different strengths according to the second control signal S2. Then, the light source 110 generates different colored lights, which are projected to an image generator (not illustrated), such as a DMD or an LCD chip set, to generate an optical image signal. The optical image signal can be projected to the exterior of the projector 100 via a lens (not illustrated).

In the present exemplary embodiment, the drive circuit 120, the first voltage converter 130 and the light source driver 140 are located on the primary side (high voltage side), the second voltage converter 150 and the isolation circuit 170 cross over the primary side and the secondary side, and the control circuit 160 is located on the secondary side (low voltage side). Therefore, in the present exemplary embodiment, the isolation circuit 170 is interposed between the light source driver 140 and the control circuit 160. The first control signal S1 outputted by the control circuit 160 belongs to a low voltage small signal; the second control signal S2 outputted by the isolation circuit 170 belongs to a high voltage large signal.

In practical implementation, the first voltage V1 (such as an AC of 110 or 220V) may be lower than the second voltage V2 (such as a DC of 380V); the second voltage V2 may be higher than the third voltage V3 (such as a DC of 48V); the second voltage V2 may be higher than the fourth voltage V4 (such as a DC of 3.3V or 12V).

The first voltage converter 130 can be a power factor correction (PFC) circuit. The second voltage converter 150 can be a flyback converter. The control circuit 160 can be formed on a motherboard. The light source 110 may include a laser diode or an LED. The light source driver 140 can be a diode driver. Based on actual needs, the transistor included in the light source driver 140 can be realized by a metal oxide semiconductor field effect transistor (MOSFET) of a laser driver. The MOSFET can be operated under a higher voltage (such as 600V).

The light source driver 140 generates the third voltage V3 with different time periods according to the second control signal S2 outputted by the isolation circuit 170. The third voltage V3 provides to the light source 110 for generate lights. The light source 110 can further send back its current value to the light source driver 140, which can therefore control the current provided to the light source 110 more precisely.

Figure 2:
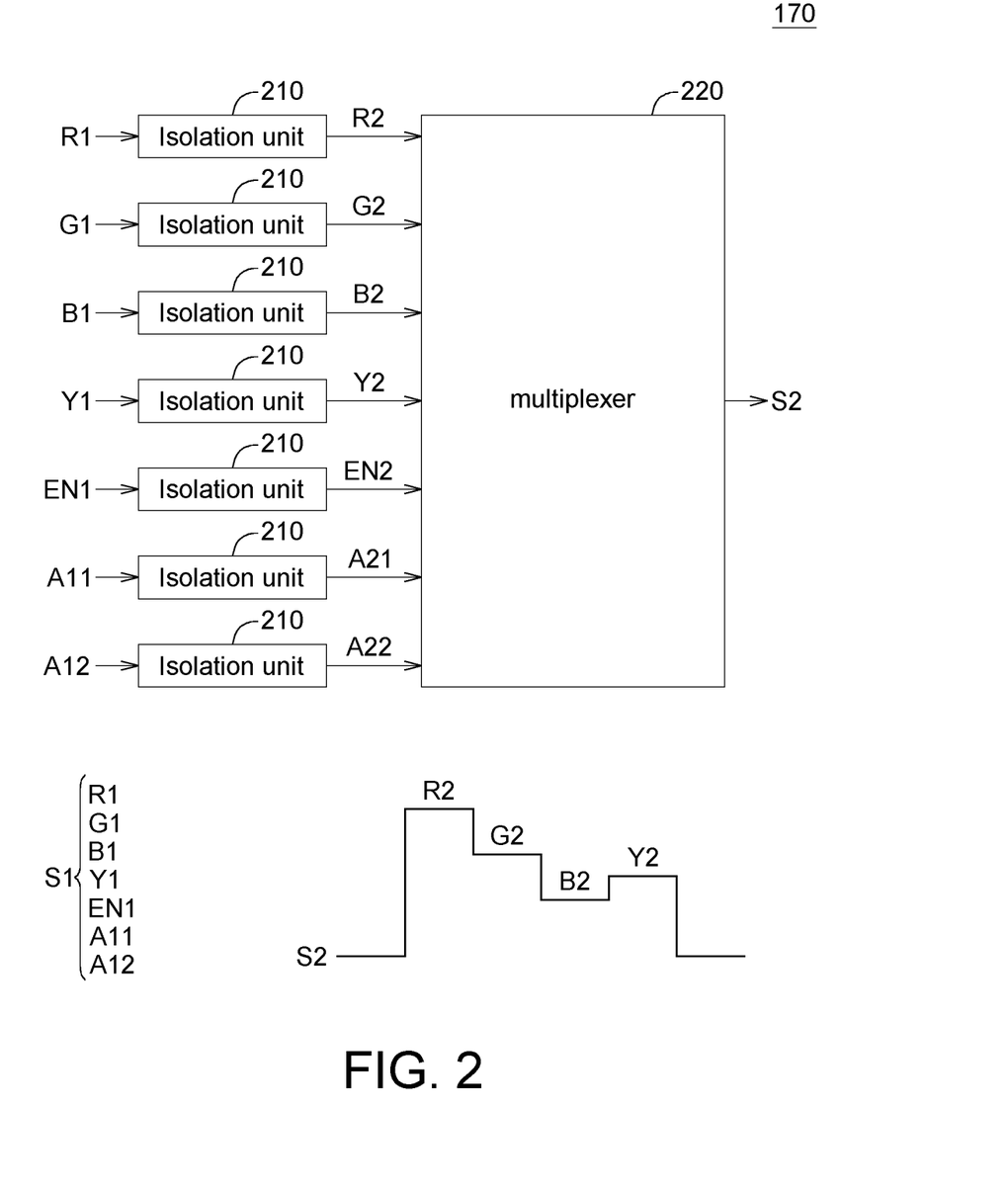
FIG. 2 is a schematic diagram showing the composition and operation of an isolation circuit according to an exemplary embodiment of the present disclosure.

Referring to FIG. 2, a schematic diagram showing the composition and operation of an isolation circuit 170 according to an exemplary embodiment of the present disclosure is shown. As indicated in FIG. 2, the isolation circuit 170 includes a plurality of isolation elements 210 and a multiplexer 220. The isolation elements 210 are coupled to the multiplexer 220. The isolation elements 210 are configured to generate a second red signal R2, a second green signal G2, a second blue signal B2, a second yellow signal Y2, a second enable signal EN2, a third selection signal A21 and a fourth selection signal A22 from the first red signal R1, the first green signal G1, the first blue signal B1, the first yellow signal Y1, the first enable signal EN1, the first selection signal A11 and the second selection signal A12, respectively. The first red signal R1, the first green signal G1, the first blue signal B1, the first yellow signal Y1, the first enable signal EN1, the first selection signal A11 and the second selection signal A12 belong to low voltage small signals. The second red signal R2, the second green signal G2, the second blue signal B2, the second yellow signal Y2, the second enable signal EN2, the third selection signal A21 and the fourth selection signal A22 belong to high voltage large signals. That is, the first control signal S1 outputted by the control circuit 160 includes a first red signal R1, a first green signal G1, a first blue signal B1, a first yellow signal Y1, a first enable signal EN1, a first selection signal A11 and a second selection signal A12.

The second red signal R2, the second green signal G2, the second blue signal B2, the second yellow signal Y2, the second enable signal EN2, the third selection signal A21 and the fourth selection signal A22 are inputted to the multiplexer 220. When the second enable signal EN2 is in an enable state (exemplarily but not restrictively, logic high state), the multiplexer 220 outputs the second control signal S2; when the second enable signal EN2 is in a disable state (exemplarily but not restrictively, logic low state), the multiplexer 220 does not output the second control signal S2. The third selection signal A21 and the fourth selection signal A22 are configured to control the multiplexer 220 to output one of the second red signal R2, the second green signal G2, the second blue signal B2, the second yellow signal Y2 as the second control signal S2. Refer to Table 2:

| A21 | A22 | S2 |
|-----|-----|-----|
| 0 | 0 | R2 |
| 0 | 1 | G2 |
| 1 | 0 | B2 |
| 1 | 1 | Y2 |

That is, when the third selection signal A21 and the fourth selection signal A22 both are logic 0, the multiplexer 220 outputs the second red signal R2 as the second control signal S2. The rest can be obtained by the same analogy.

Figure 3:
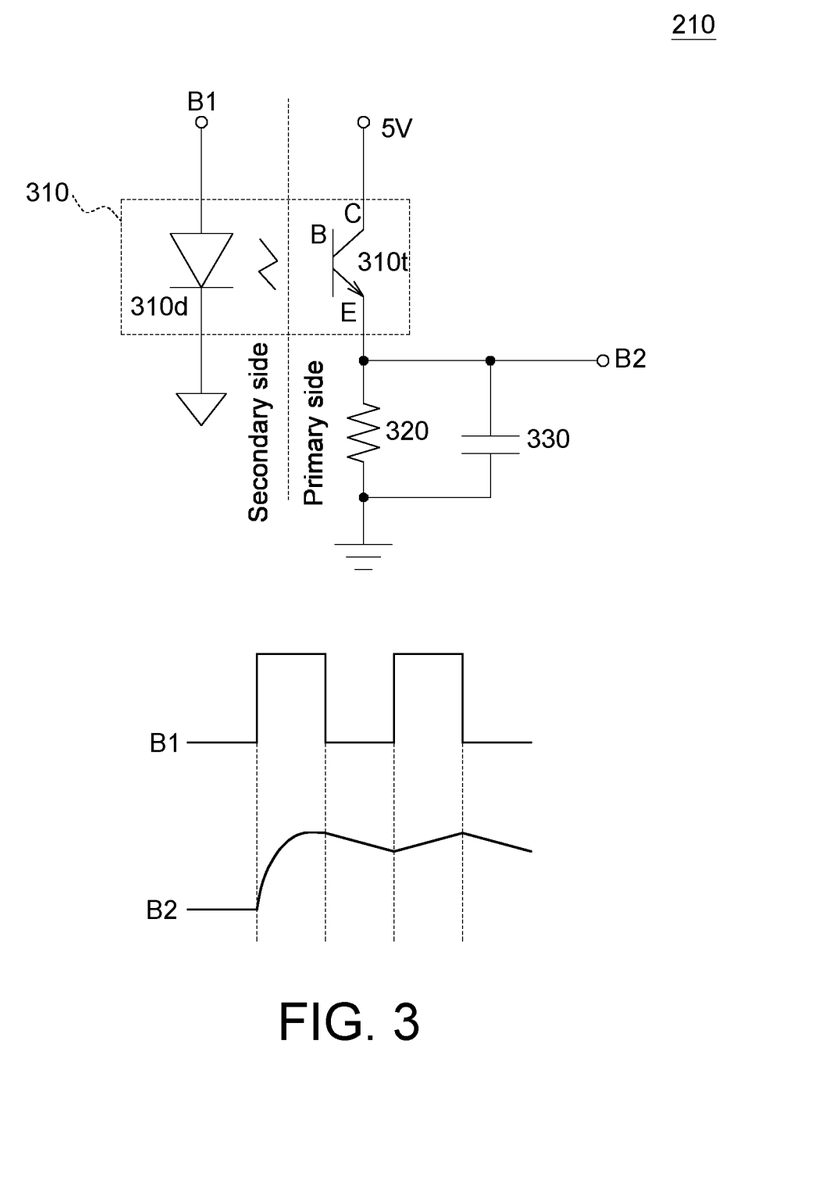
FIGS. 3-5 are schematic diagrams showing the composition and operation of the isolation elements according to several exemplary embodiments of the present disclosure.

FIG. 3 is a schematic diagram showing the composition and operation of the isolation elements 210 according to an exemplary embodiment of the present disclosure. As indicated in FIG. 3, each isolation element 210 includes a photo coupler 310, a resistor 320 and a capacitor 330. The photo coupler 310 includes an LED 310d and a phototransistor 310t. The LED 310d is located on the secondary side. The phototransistor 310t, the resistor 320 and the capacitor 330 are located on the primary side.

FIG. 3 is exemplified by the situation in which the isolation elements 210 receive the first blue signal B1 to generate the second blue signal B2. The second red signal R2, the second green signal G2, the second yellow signal Y2, the second enable signal EN2, the third selection signal A21 and the fourth selection signal A22 can be generated by the same analogy.

One end of the LED 310d receives the first blue signal B1, and the other end of the LED 310d is grounded. The first blue signal B1 is a PWM signal.

The base of the phototransistor 310t is in an open state, the collector of the phototransistor 310t is connected to the operating voltage (such as 5V), and the emitter of the phototransistor 310t is connected to the resistor 320 and the capacitor 330.

One end of the resistor 320 is connected to the emitter of the phototransistor 310t, and the other end of the resistor 320 is grounded.

One end of the capacitor 330 is connected to the emitter of the phototransistor 310t, and the other end of the capacitor 330 is grounded. The second blue signal B2 is a cross-voltage on the capacitor 330. The capacitor 330 has an effect of signal integration.

Details of the operation of the isolation elements 210 of FIG. 3 are disclosed below. When the first blue signal B1 is logic high, the LED 310d illuminates, such that the phototransistor 310t is conducted. Since the phototransistor 310t is conducted, the second blue signal B2 having been integrated by the capacitor 330 is also logic high.

When the first blue signal B1 is logic low, the LED 310d does not illuminate, such that the phototransistor 310t is disconnected. Since the phototransistor 310t is disconnected, the capacitor 330 gradually discharges, and the potential of the second blue signal B2 gradually drops.

Figure 4:
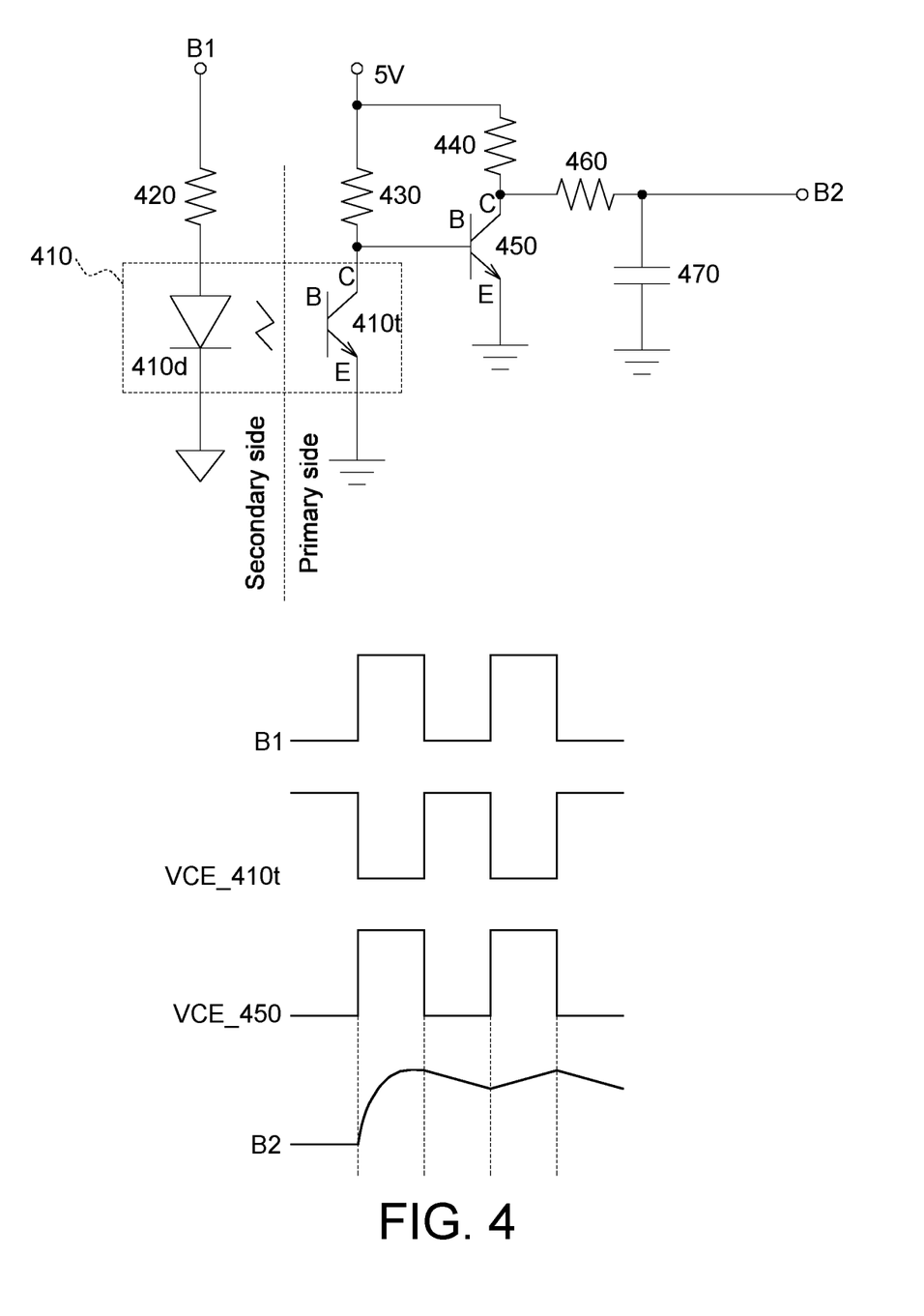

FIG. 4 is a schematic diagram showing the composition and operation of the isolation elements 210 according to an exemplary embodiment of the present disclosure. As indicated in FIG. 4, each isolation element 210 includes a photo coupler 410, resistors 420, 430, 440 and 460, a BJT transistor 450 and a capacitor 470. The photo coupler 410 includes an LED 410d and a phototransistor 410t. The LED 410d and the resistor 420 are located on the secondary side. The phototransistor 410t, the resistors 430, 440 and 460, the BJT transistor 450 and the capacitor 470 are located on the primary side.

One end of the LED 410d receives the first blue signal B1 through the resistor 420, and the other end of the LED 410d is grounded. The first blue signal B1 is a PWM signal. The resistor 420 is interposed between one end of the LED 410d and the first blue signal B1.

The base of the phototransistor 410t is in an open state, and the collector of the phototransistor 410t is connected to the resistor 430 and the base of the BJT transistor 450, and the emitter is grounded.

One end of the resistor 430 is connected to the collector of the phototransistor 310t, and the other end of the resistor 430 is connected to the operating voltage. One end of the resistor 440 is connected to the collector of the BJT transistor 450, and the other end of the resistor 440 is connected to the operating voltage. One end of the resistor 460 is connected to the collector of the BJT transistor 450, and the other end of the resistor 460 is connected to the capacitor 470.

The base of the BJT transistor 450 is connected to the collector of the phototransistor 410t, the collector of the BJT transistor 450 is connected to the resistors 440 and 460, and the emitter is grounded.

One end of the capacitor 470 is connected to the resistor 460, and the other end is grounded. The second blue signal B2 is a cross-voltage on the capacitor 470. The capacitor 470 has an effect of signal integration.

Details of the operation of the isolation elements 210 of FIG. 4 are disclosed below. When the first blue signal B1 is logic high, the LED 410d illuminates, such that the phototransistor 410t is conducted (the designation VCE_410t of FIG. 4 represents the collector-emitter voltage of the phototransistor 410t; similarly, the designation VCE_450 represents the collector-emitter voltage of the BJT transistor 450). Since the phototransistor 410t is conducted, the base of the BJT transistor 450 drops and the BJT transistor 450 is turned off. Therefore, the collector-emitter voltage VCE_450 of the BJT transistor 450 is logic high. The collector-emitter voltage VCE_450 of the BJT transistor 450 is logic high, and is integrated as the logic high second blue signal B2 by the capacitor 470.

When the first blue signal B1 is logic low, the LED 410d does not illuminate, such that the phototransistor 410t is disconnected. Since the phototransistor 410t is disconnected, the base of the BJT transistor 450 is logic high, and the BJT transistor 450 is conducted. Therefore, the cross-voltage of the capacitor 470 drops, that is, the voltage of the second blue signal B2 gradually drops.

Figure 5:
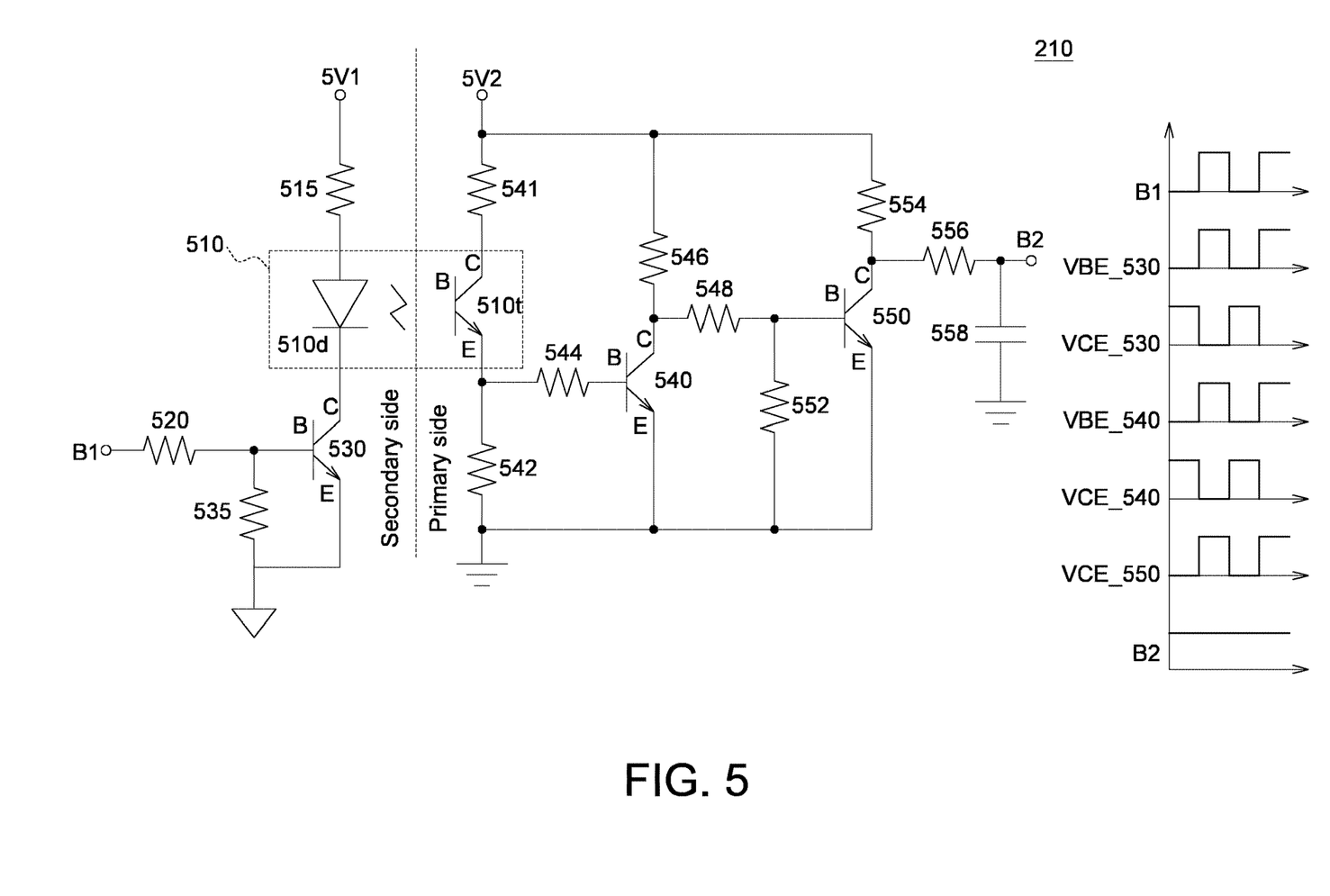

FIG. 5 is a schematic diagram showing the composition and operation of the isolation elements 210 according to an exemplary embodiment of the present disclosure. As indicated in FIG. 5, each isolation element 210 includes a photo coupler 510, a resistor 515, the resistor 520, a BJT transistor 530, a resistor 535, a BJT transistor 540, a resistor 541, a resistor 542, a resistor 544, a resistor 546, a resistor 548, a BJT transistor 550, a resistor 552, a resistor 554, a resistor 556 and a capacitor 558. The photo coupler 510 includes an LED 510d and a phototransistor 510t. The LED 510d, the resistor 515, the resistor 520, the BJT transistor 530 and the resistor 535 are located on the secondary side. The phototransistor 510t, the BJT transistor 540, the resistor 541, the resistor 542, the resistor 544, the resistor 546, the resistor 548, the BJT transistor 550, the resistor 552, the resistor 554, the resistor 556 and the capacitor 558 are located on the primary side.

One end of the LED 510d is coupled to the operating voltage through the resistor 515, and the other end of the LED 510d is connected to the collector of the BJT transistor 530. The first blue signal B1 is a PWM signal. The resistor 515 is interposed between the operating voltage and one end of the LED 510d. The resistor 520 is interposed between the base of the BJT transistor 530 and the first blue signal B1.

The base of the BJT transistor 530 receives the first blue signal B1 through the resistor 520, the collector of the BJT transistor 530 is connected to one end of the LED 510d, and the emitter of the BJT transistor 530 is grounded.

One end of the resistor 535 is connected to the base of the BJT transistor 530, the other end of the resistor 535 is connected to the emitter of the BJT transistor 530 and the ground end.

The base of the phototransistor 510t is in an open state, the collector of the phototransistor 510t is connected to the operating voltage through the resistor 541, and the emitter of the phototransistor 510t is grounded through the resistor 542.

The base of the BJT transistor 540 is connected to the emitter of the phototransistor 510t, the collector of the BJT transistor 540 is connected to the operating voltage through the resistor 546 and is also connected to the base of the BJT transistor 550 through the resistor 548, and the emitter of the BJT transistor 540 is grounded.

The resistor 541 is connected between the operating voltage and the collector of the phototransistor 510t. The resistor 542 is connected between the emitter of the phototransistor 510t and the ground end. The resistor 544 is connected between the emitter of the phototransistor 510t and the base of the BJT transistor 540.

The resistor 546 is connected between the operating voltage and the collector of the BJT transistor 540.

The resistor 548 is connected between the collector of the BJT transistor 540 and the base of the BJT transistor 550.

The base of the BJT transistor 550 is connected to the collector of the BJT transistor 540 through the resistor 548 and grounded through the resistor 552, the collector of the BJT transistor 550 is connected to the operating voltage through the resistor 554 and connected to one end of the resistor 556, and the emitter of the BJT transistor 550 is grounded.

The resistor 552 is connected between the base of the BJT transistor 550 and the ground end. The resistor 554 is connected between the operating voltage and the collector of the BJT transistor 550. The resistor 556 is connected between the collector of the BJT transistor 550 and one end of the capacitor 558.

One end of the capacitor 558 is connected to the resistor 556, and the other end is grounded. The second blue signal B2 is a cross-voltage on the capacitor 558. The capacitor 558 has an effect of signal integration.

Details of the operation of the isolation elements 210 of FIG. 5 are disclosed below. When the first blue signal B1 is logic high, the base-emitter voltage VBE_530 of the BJT transistor 530 is triggered to a high level, and the collector-emitter voltage of VCE_530 of the BJT transistor 530 is at a low level (that is, the BJT transistor 530 is conducted). Thus, the LED 510d illuminates, and the phototransistor 510t is conducted. Since the phototransistor 510t is conducted, the base-emitter voltage VBE_540 of the BJT transistor 540 is at a high level, and the collector-emitter voltage VCE_540 of the BJT transistor 540 is at a low level (that is, the BJT transistor 540 is conducted). Since the BJT transistor 540 is conducted, the base voltage of the BJT transistor 550 drops, and the collector-emitter voltage of the BJT transistor 550 is at a high level (such that the BJT transistor 550 is disconnected). Since the BJT transistor 550 is disconnected, the operating voltage charges the capacitor 558 through the resistors 554 and 556 as the logic high second blue signal B2.

When the first blue signal B1 is logic low, the BJT transistor 530 is disconnected, and the LED 510d does not illuminate, such that the phototransistor 510t is disconnected. Since the phototransistor 510t is disconnected, the BJT transistor 540 is disconnected. Since the BJT transistor 540 is disconnected, the base voltage of the BJT transistor 550 is at a high level, such that the BJT transistor 550 is conducted. Since the BJT transistor 550 is conducted, the capacitor 558 discharges, such that the second blue signal B2 gradually drops (in FIG. 5, when the first blue signal B1 is logic low, the second blue signal B2 gradually drops).

In above exemplary embodiments of the present disclosure, the electrical isolation provided by the isolation circuit 170 can assure the safety in the operation of projector. This is because the electrical isolation provided by the isolation circuit 170 can electrically isolate the ground end of the primary side from the ground end of the secondary side. That is, the electrical isolation provided by the isolation circuit 170 can isolate the light source driver 140 on the primary side from the control circuit 160 on the secondary side.

Conventional technology requires the use of an LLC converter, and therefore has poor energy efficiency of the drive circuit and increases the cost of the projector drive circuit. In the above exemplary embodiments of the present disclosure, the projector drive circuit of the exemplary embodiments of the present disclosure can operate normally even in the absence of the LLC converter, and therefore improve the energy efficiency of the drive circuit and reduce the cost of the projector drive circuit.

Figure 6:
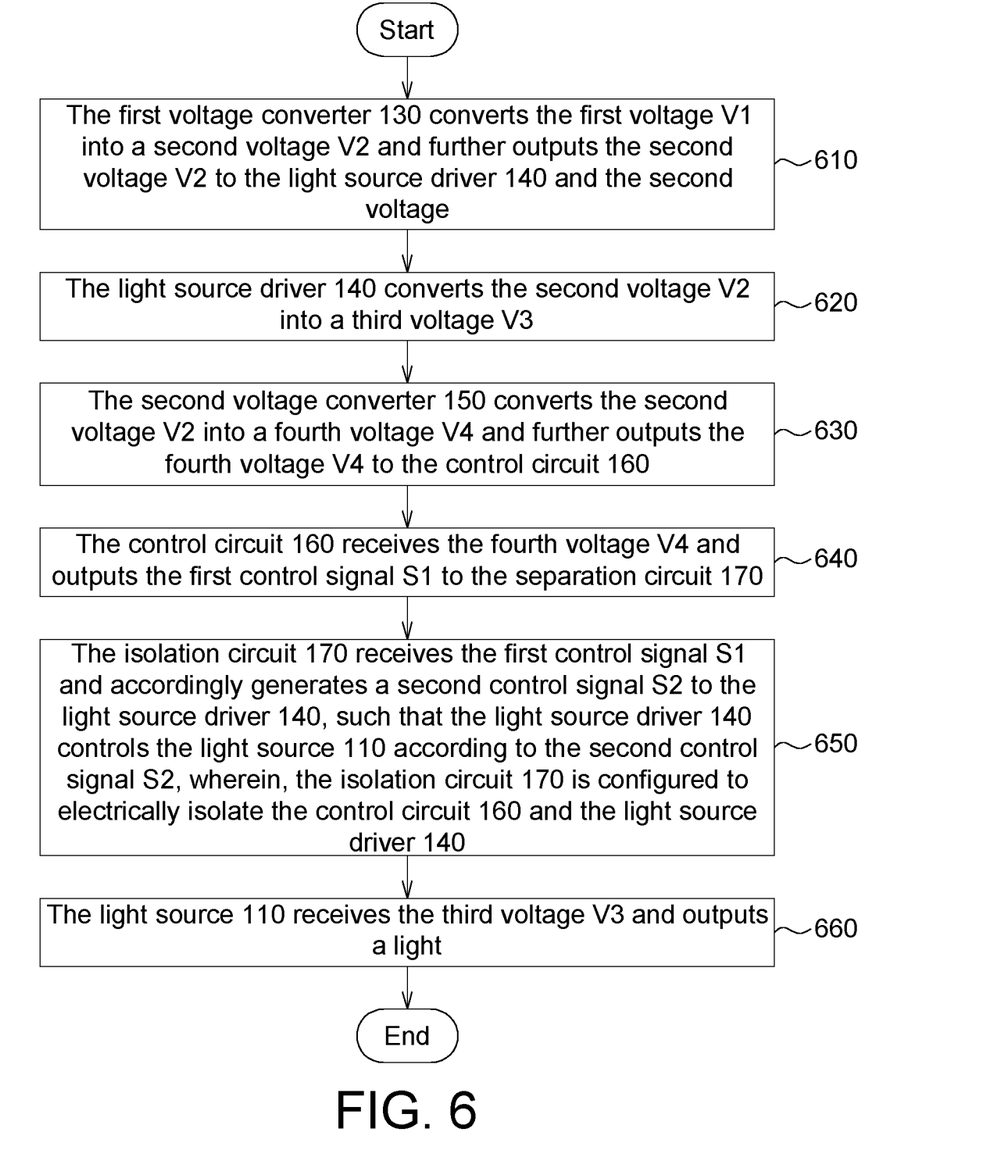
FIG. 6 is a flowchart of a projector drive method according to an exemplary embodiment of the present disclosure.

FIG. 6 is a flowchart of a projector drive method according to an exemplary embodiment of the present disclosure. In step 610, the first voltage converter 130 converts the first voltage V1 into a second voltage V2 and further outputs the second voltage V2 to the light source driver 140 and the second voltage.

In step 620, the light source driver 140 converts the second voltage V2 into a third voltage V3. In step 630, the second voltage converter 150 converts the second voltage V2 into a fourth voltage V4 and further outputs the fourth voltage V4 to the control circuit 160. In step 640, the control circuit 160 receives the fourth voltage V4 and outputs the first control signal S1 to the isolation circuit 170. In step 650, the isolation circuit 170 receives the first control signal S1 and accordingly generates a second control signal S2 to the light source driver 140, such that the light source driver 140 controls the light source 110 according to the second control signal S2, wherein, the isolation circuit 170 is configured to electrically isolate the control circuit 160 and the light source driver 140. In step 660, the light source 110 receives the third voltage V3 and outputs a light.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A projector drive circuit, comprising:
   a first voltage converter configured to convert a first voltage into a second voltage;
   a light source driver coupled to the first voltage converter to convert the second voltage into a third voltage;
   a second voltage converter coupled to the first voltage converter to convert the second voltage into a fourth voltage;
   a control circuit coupled to the second voltage converter to receive the fourth voltage and output a first control signal; and
   an isolation circuit coupled to the control circuit and the light source driver to receive the first control signal and accordingly generate a second control signal to the light source driver, which controls the light source driver to generate the third voltage and provide the third voltage to a light source according to the second control signal;

wherein, the isolation circuit is configured to electrically isolate the control circuit from the light source driver,
wherein the isolation circuit comprises: a plurality of isolation elements and a multiplexer;
the plurality of isolation elements are configured to generate a second red signal, a second green signal, a second blue signal, a second yellow signal, a second enable signal, a third selection signal and a fourth selection signal from a first red signal, a first green signal, a first blue signal, a first yellow signal, a first enable signal, a first selection signal and a second selection signal respectively, wherein, the first red signal, the first green signal, the first blue signal, the first yellow signal, the first enable signal, the first selection signal and the second selection signal are comprised in the first control signal;
the isolation elements are coupled to the multiplexer; the second red signal, the second green signal, the second blue signal, the second yellow signal, the second enable signal, the third selection signal and the fourth selection signal are inputted to the multiplexer,
when the second enable signal is in an enable state, the multiplexer outputs the second control signal;
when the second enable signal is in a disable state, the multiplexer does not output the second control signal; and
the third selection signal and the fourth selection signal are configured to control the multiplexer to output one of the second red signal, the second green signal, the second blue signal, the second yellow signal as the second control signal.

2. The drive circuit according to claim 1, wherein,
the first voltage converter comprises a first terminal configured to receive the first voltage and a second terminal configured to output the second voltage, wherein the first voltage is an AC voltage provided by a mains supply, and the second voltage is a DC voltage;
the light source driver comprises a third terminal coupled to the second terminal of the first voltage converter and a fourth terminal configured to output the third voltage to the light source, wherein the third voltage is a DC voltage lower than the second voltage;
the second voltage converter comprises a fifth terminal coupled to the second terminal of the first voltage converter and a sixth terminal configured to output the fourth voltage, wherein the fourth voltage is a DC voltage;
the control circuit comprises a seventh terminal coupled to the sixth terminal of the second voltage converter and an eighth terminal configured to output the first control signal;
the isolation circuit comprises a ninth terminal coupled to the eighth terminal of the control circuit and a tenth terminal configured to output the second control signal.

3. The drive circuit according to claim 1, wherein,
the first voltage converter and the light source driver are located on a primary side of the drive circuit;
the control circuit is located on a secondary side of the drive circuit; and
the second voltage converter and the isolation circuit cross over the primary side and the secondary side.

4. The drive circuit according to claim 1, wherein, the isolation element comprises:
a photo coupler comprises an LED and a phototransistor, and
a resistor and a capacitor coupled to the phototransistor;

wherein, the LED is located on the secondary side; the phototransistor, the resistor and the capacitor are located on the primary side;
when an input signal is logic high, the LED illuminates, such that the phototransistor is conducted to generate a logic high output signal on the capacitor,
when the input signal is logic low, the LED does not illuminate, such that the phototransistor is disconnected, the capacitor gradually discharges, and the outputted potential gradually drops, wherein, the input signal is one of the first red signal, the first green signal, the first blue signal, the first yellow signal, the first enable signal, the first selection signal and the second selection signal; the output signal is one of the second red signal, the second green signal, the second blue signal, the second yellow signal, the second enable signal, the third selection signal and the fourth selection signal.

5. The drive circuit according to claim 1, wherein, the isolation element comprises a photo coupler, a BJT transistor and a capacitor; the photo coupler comprises an LED and a phototransistor; the LED is located on the secondary side; the phototransistor, the BJT transistor and the capacitor are located on the primary side; the BJT transistor and the capacitor are coupled to the phototransistor,
wherein, when an input signal is logic high, the LED illuminates, such that the phototransistor is conducted and the BJT transistor is turned off to generate a logic high output signal on the capacitor;
when the input signal is logic low, the LED does not illuminate, such that the phototransistor is disconnected, the BJT transistor is conducted, and the output signal on the capacitor is gradually reduced,
the input signal is one of the first red signal, the first green signal, the first blue signal, the first yellow signal, the first enable signal, the first selection signal and the second selection signal; the output signal is one of the second red signal, the second green signal, the second blue signal, the second yellow signal, the second enable signal, the third selection signal and the fourth selection signal.

6. The drive circuit according to claim 1, wherein, the isolation element comprises a photo coupler, a first BJT transistor, a second BJT transistor, a third BJT transistor, and a capacitor; the photo coupler comprises an LED and a phototransistor; the LED and the first BJT transistor are located on the secondary side; the phototransistor, the second BJT transistor, the third BJT transistor and the capacitor are located on the primary side; the LED is coupled to the first BJT transistor; the phototransistor is coupled to the second BJT transistor, the third BJT transistor and the capacitor;
when an input signal is logic high, the first BJT transistor is conducted and the LED illuminates, such that the phototransistor is conducted, the second BJT transistor is conducted, the third BJT transistor is disconnected, and the capacitor outputs a logic high output signal;
when the input signal is logic low, the first BJT transistor is disconnected and the LED does not illuminate, such that the phototransistor is disconnected, the second BJT transistor is disconnected, the third BJT transistor is conducted, the capacitor discharges, and the output signal is gradually reduced,
the input signal is one of the first red signal, the first green signal, the first blue signal, the first yellow signal, the first enable signal, the first selection signal and the second selection signal; the output signal is one of the second red signal, the second green signal, the second blue signal, the second yellow signal, the second enable signal, the third selection signal and the fourth selection signal.

7. A projector drive method, comprising:

converting a first voltage into a second voltage and outputting the second voltage to a light source driver and a second voltage converter by a first voltage converter;

converting the second voltage into a third voltage by the light source driver;

converting the second voltage into a fourth voltage and outputting the fourth voltage to a control circuit by the second voltage converter;

receiving the fourth voltage and outputting a first control signal to an isolation circuit by the control circuit;

receiving the first control signal and accordingly generating a second control signal to the light source driver by the isolation circuit, wherein the light source driver generates the third voltage according to the second control signal, and the isolation circuit is configured to electrically isolate the control circuit from the light source driver; and receiving the third voltage and providing a light by the light source, wherein the isolation circuit comprises: a plurality of isolation elements and a multiplexer;

the plurality of isolation elements are configured to generate a second red signal, a second green signal, a second blue signal, a second yellow signal, a second enable signal, a third selection signal and a fourth selection signal from a first red signal, a first green signal, a first blue signal, a first yellow signal, a first enable signal, a first selection signal and a second selection signal respectively, wherein, the first red signal, the first green signal, the first blue signal, the first yellow signal, the first enable signal, the first selection signal and the second selection signal are comprised in the first control signal;

the isolation elements are coupled to the multiplexer; the second red signal, the second green signal, the second blue signal, the second yellow signal, the second enable signal, the third selection signal, and the fourth selection signal are inputted to the multiplexer, when the second enable signal is in an enable state, the multiplexer outputs the second control signal;

when the second enable signal is in a disable state, the multiplexer does not output the second control signal; and the third selection signal and the fourth selection signal are configured to control the multiplexer to output one of the second red signal, the second green signal, the second blue signal, the second yellow signal as the second control signal.

8. A projector, comprising:

a light source, a drive circuit coupled to the light source, wherein the drive circuit comprises:

a first voltage converter configured to convert a first voltage into a second voltage;

a light source driver coupled to the first voltage converter to convert the second voltage into a third voltage;

a second voltage converter coupled to the first voltage converter to convert the second voltage into a fourth voltage;

a control circuit coupled to the second voltage converter to receive the fourth voltage and output a first control signal; and an isolation circuit coupled to the control circuit and the light source driver to receive the first control signal and accordingly generate a second control signal to the light source driver, which controls the light source driver to generate the third voltage according to the second control signal, the light source receives the third voltage and provides a light;

wherein, the isolation circuit is configured to electrically isolate the control circuit from the light source driver, and the isolation circuit comprises: a plurality of isolation elements and a multiplexer;

the plurality of isolation elements are configured to generate a second red signal, a second green signal, a second blue signal, a second yellow signal, a second enable signal, a third selection signal and a fourth selection signal from a first red signal, a first green signal, a first blue signal, a first yellow signal, a first enable signal, a first selection signal and a second selection signal respectively, wherein, the first red signal, the first green signal, the first blue signal, the first yellow signal, the first enable signal, the first selection signal and the second selection signal are comprised in the first control signal; and the isolation elements are coupled to the multiplexer; the second red signal, the second green signal, the second blue signal, the second yellow signal, the second enable signal, the third selection signal, and the fourth selection signal are inputted to the multiplexer, when the second enable signal is in an enable state, the multiplexer outputs the second control signal;

when the second enable signal is in a disable state, the multiplexer does not output the second control signal; and the third selection signal and the fourth selection signal are configured to control the multiplexer to output one of the second red signal, the second green signal, the second blue signal, the second yellow signal as the second control signal.

9. The projector according to claim 8, wherein, the first voltage converter comprises a first terminal configured to receive the first voltage and a second terminal configured to output the second voltage, wherein the first voltage is an AC voltage provided by a mains supply, and the second voltage is a DC voltage;

the light source driver comprises a third terminal coupled to the second terminal of the first voltage converter and a fourth terminal configured to output the third voltage to the light source, wherein the third voltage is a DC voltage lower than the second voltage;

the second voltage converter comprises a fifth terminal coupled to the second terminal of the first voltage converter and a sixth terminal configured to output the fourth voltage, wherein the fourth voltage is a DC voltage;

the control circuit comprises a seventh terminal coupled to the sixth terminal of the second voltage converter and an eighth terminal configured to output the first control signal;

the isolation circuit comprises a ninth terminal coupled to the eighth terminal of the control circuit and a tenth terminal configured to output the second control signal.

10. The projector according to claim 8, wherein, the first voltage converter and the light source driver are located on the primary side;

the control circuit is located on the secondary side; and
the second voltage converter and the isolation circuit cross over the primary side and the secondary side.

11. The projector according to claim 8, wherein, the isolation element comprises:
a photo coupler comprises an LED and a phototransistor, and
a resistor and a capacitor coupled to the phototransistor;
wherein, the LED is located on the secondary side; the phototransistor, the resistor and the capacitor are located on the primary side;
when an input signal is logic high, the LED illuminates, such that the phototransistor is conducted to generate a logic high output signal on the capacitor,
when the input signal is logic low, the LED does not illuminate, such that the phototransistor is disconnected, the capacitor gradually discharges, and the outputted potential gradually drops, wherein, the input signal is one of the first red signal, the first green signal, the first blue signal, the first yellow signal, the first enable signal, the first selection signal and the second selection signal; the output signal is one of the second red signal, the second green signal, the second blue signal, the second yellow signal, the second enable signal, the third selection signal and the fourth selection signal.

12. The projector according to claim 8, wherein, the isolation element comprises a photo coupler, a BJT transistor and a capacitor; the photo coupler comprises an LED and a phototransistor; the LED is located on the secondary side; the phototransistor, the BJT transistor and the capacitor are located on the primary side; the BJT transistor and the capacitor are coupled to the phototransistor,
wherein, when an input signal is logic high, the LED illuminates, such that the phototransistor is conducted and the BJT transistor is turned off to generate a logic high output signal on the capacitor;
when the input signal is logic low, the LED does not illuminate, such that the phototransistor is disconnected, the BJT transistor is conducted, and the output signal on the capacitor is gradually reduced,
the input signal is one of the first red signal, the first green signal, the first blue signal, the first yellow signal, the first enable signal, the first selection signal and the second selection signal;
the output signal is one of the second red signal, the second green signal, the second blue signal, the second yellow signal, the second enable signal, the third selection signal and the fourth selection signal.

13. The projector according to claim 8, wherein, the isolation element comprises: a photo coupler, a first BJT transistor, a second BJT transistor, a third BJT transistor, and a capacitor; the photo coupler comprises an LED and a phototransistor; the LED and the first BJT transistor are located on the secondary side; the phototransistor, the second BJT transistor, the third BJT transistor and the capacitor are located on the primary side; the LED is coupled to the first BJT transistor; the phototransistor is coupled to the second BJT transistor, the third BJT transistor and the capacitor;
when an input signal is logic high, the first BJT transistor is conducted and the LED illuminates, such that the phototransistor is conducted, the second BJT transistor is conducted, the third BJT transistor is disconnected, and a logic high output signal is outputted to the capacitor;
when the input signal is logic low, the first BJT transistor is disconnected and the LED does not illuminate, such that the phototransistor is disconnected, the second BJT transistor is disconnected, the third BJT transistor is conducted, the capacitor discharges, and the output signal is gradually reduced,
the input signal is one of the first red signal, the first green signal, the first blue signal, the first yellow signal, the first enable signal, the first selection signal and the second selection signal; the output signal is one of the second red signal, the second green signal, the second blue signal, the second yellow signal, the second enable signal, the third selection signal and the fourth selection signal.

* * * * *